(12) United States Patent
Yuan et al.

(10) Patent No.: US 7,745,244 B2
(45) Date of Patent: Jun. 29, 2010

(54) PIN SUBSTRATE AND PACKAGE

(75) Inventors: Zhongfa Yuan, Jiangsu (CN); Yong Liu, Scarborough, ME (US); Yumin Liu, Jiangsu (CN); Qiuxiao Qian, Jiangsu (CN)

(73) Assignee: Fairchild Semiconductor Corporation, South Portland, ME (US)

( * ) Notice: Subject to any disclaimer, the term of this patent is extended or adjusted under 35 U.S.C. 154(b) by 0 days.

(21) Appl. No.: 12/144,289

(22) Filed: Jun. 23, 2008

(65) Prior Publication Data
US 2009/0315171 A1    Dec. 24, 2009

(51) Int. Cl.
H01L 21/00    (2006.01)
(52) U.S. Cl. .............. 438/33; 438/25; 438/26; 438/55; 438/58; 438/64; 438/143
(58) Field of Classification Search ............ 438/25, 438/26, 33, 55, 58, 64, 143
See application file for complete search history.

(56) References Cited
U.S. PATENT DOCUMENTS

| | | | |
|---|---|---|---|
| 5,460,768 A * | 10/1995 | Akao et al. ............... 264/297.2 |
| 6,188,391 B1 | 2/2001 | Seely et al. |
| 6,617,680 B2 * | 9/2003 | Chien-Chih et al. ......... 257/698 |
| 6,645,791 B2 | 11/2003 | Noquil et al. |
| 7,023,077 B2 | 4/2006 | Madrid |
| 7,259,457 B2 | 8/2007 | Zhang et al. |
| 7,316,063 B2 | 1/2008 | Farnworth et al. |
| 2004/0164386 A1 | 8/2004 | Joshi |
| 2006/0170101 A1 | 8/2006 | Kaizuka |
| 2008/0296752 A1 * | 12/2008 | Nakajima ................ 257/697 |
| 2009/0063092 A1 * | 3/2009 | Pierce et al. ............. 702/167 |

* cited by examiner

Primary Examiner—Thanh V Pham
Assistant Examiner—Marvin Payen
(74) Attorney, Agent, or Firm—Townsend and Townsend and Crew LLP

(57) ABSTRACT

A semiconductor die package. Embodiments of the package can include a substrate with solid conductive pins disposed throughout. A semiconductor die can be attached to a surface of the substrate. Electrical connection to the semiconductor die can be provided by the solid conductive pins.

15 Claims, 11 Drawing Sheets

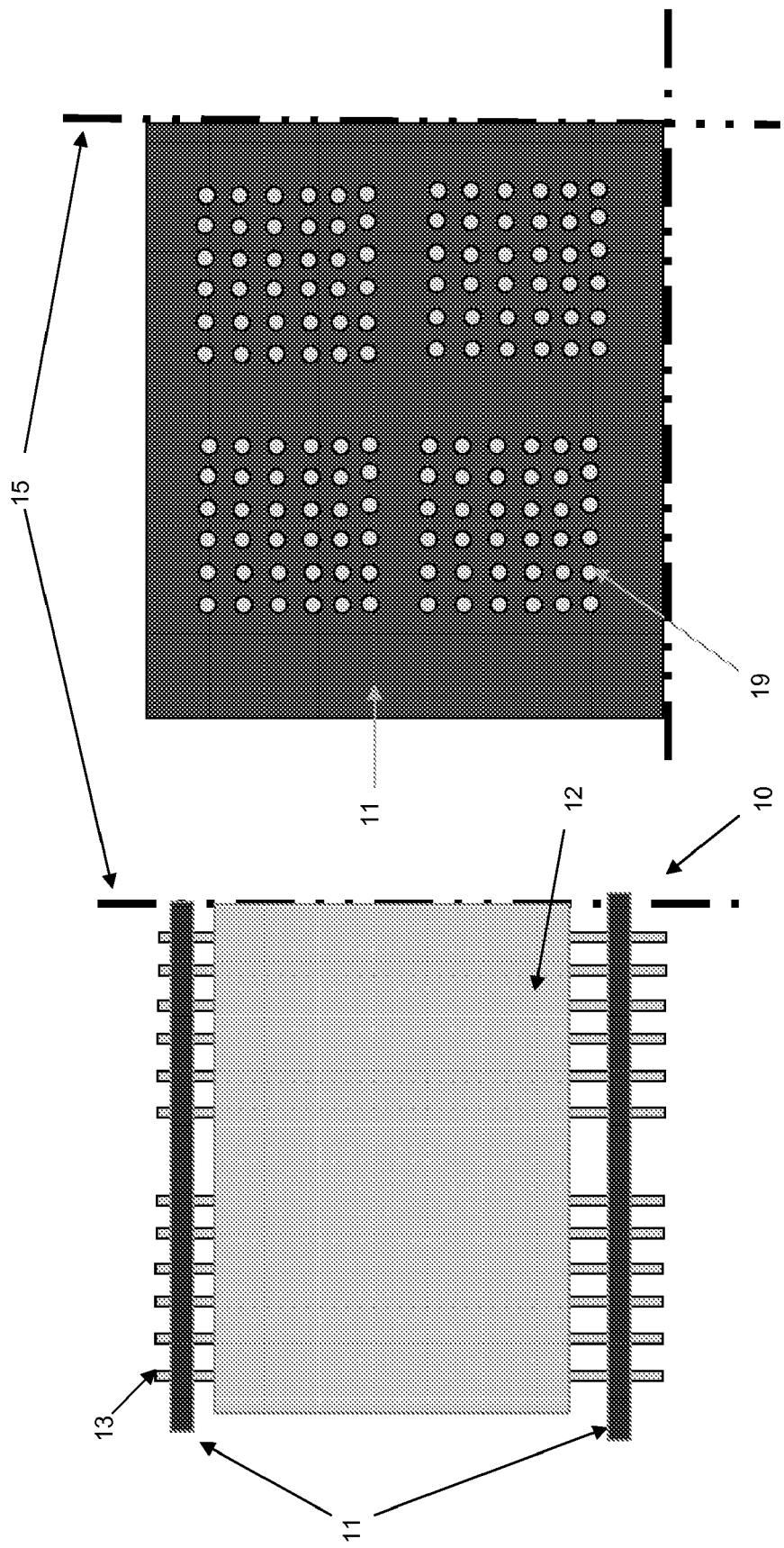

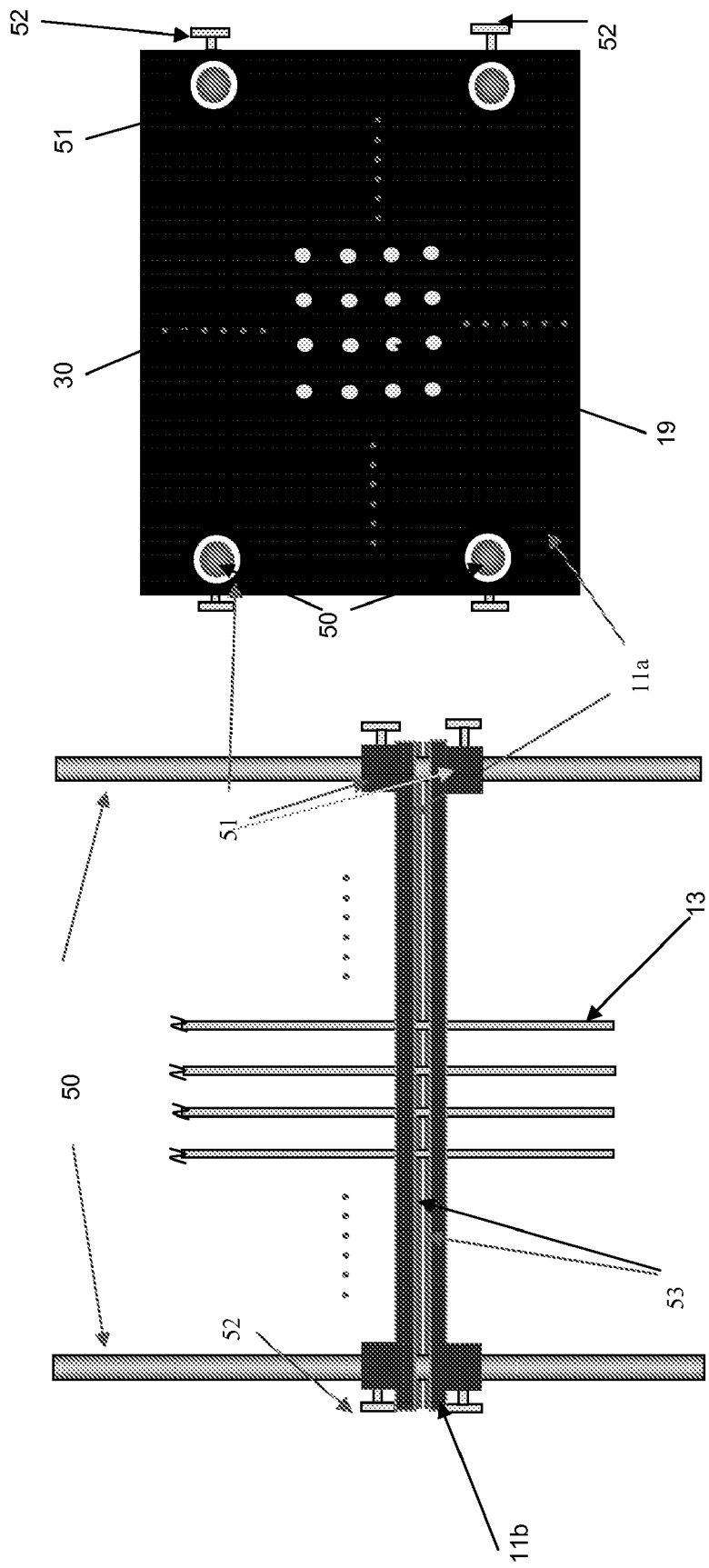

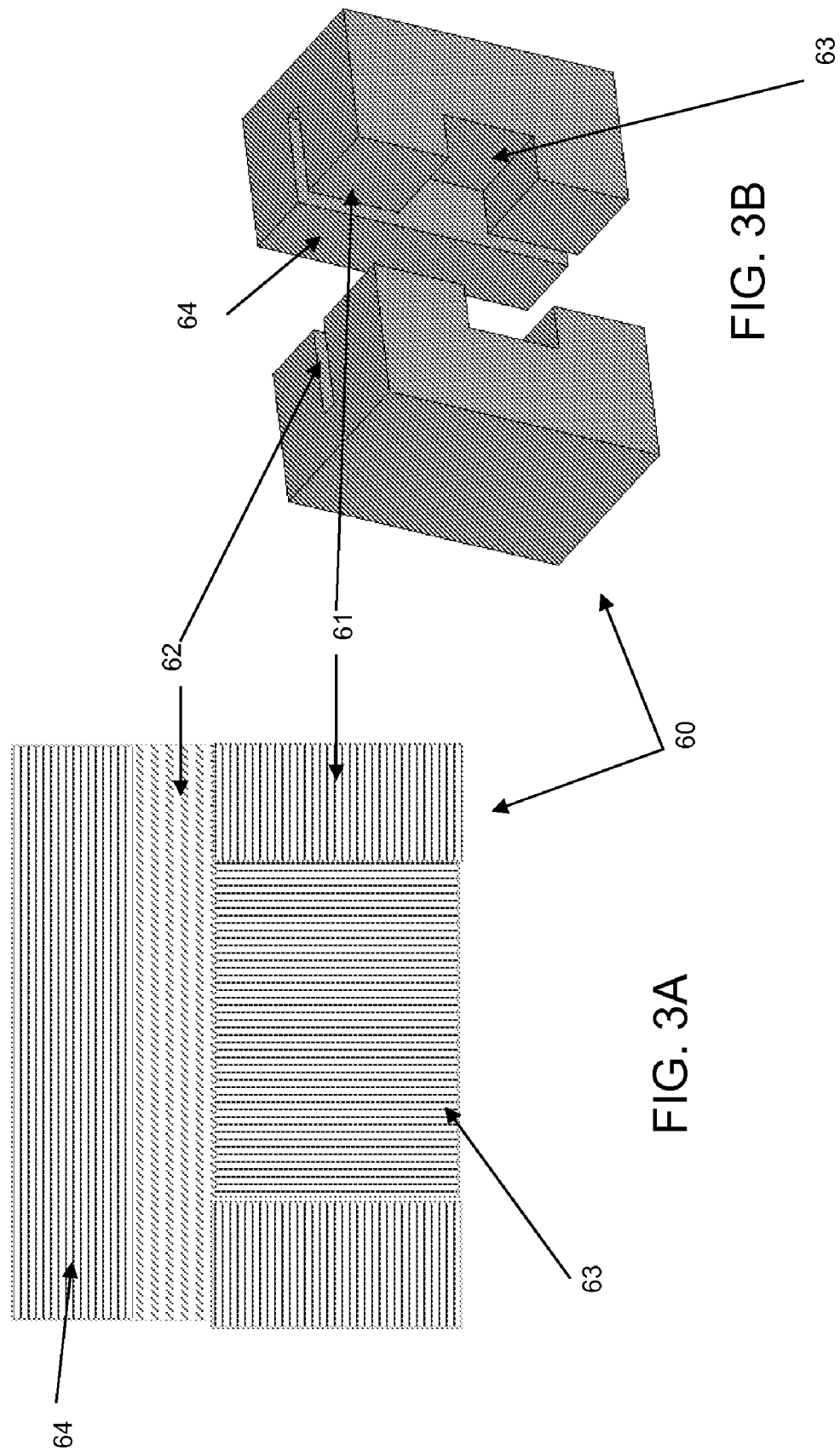

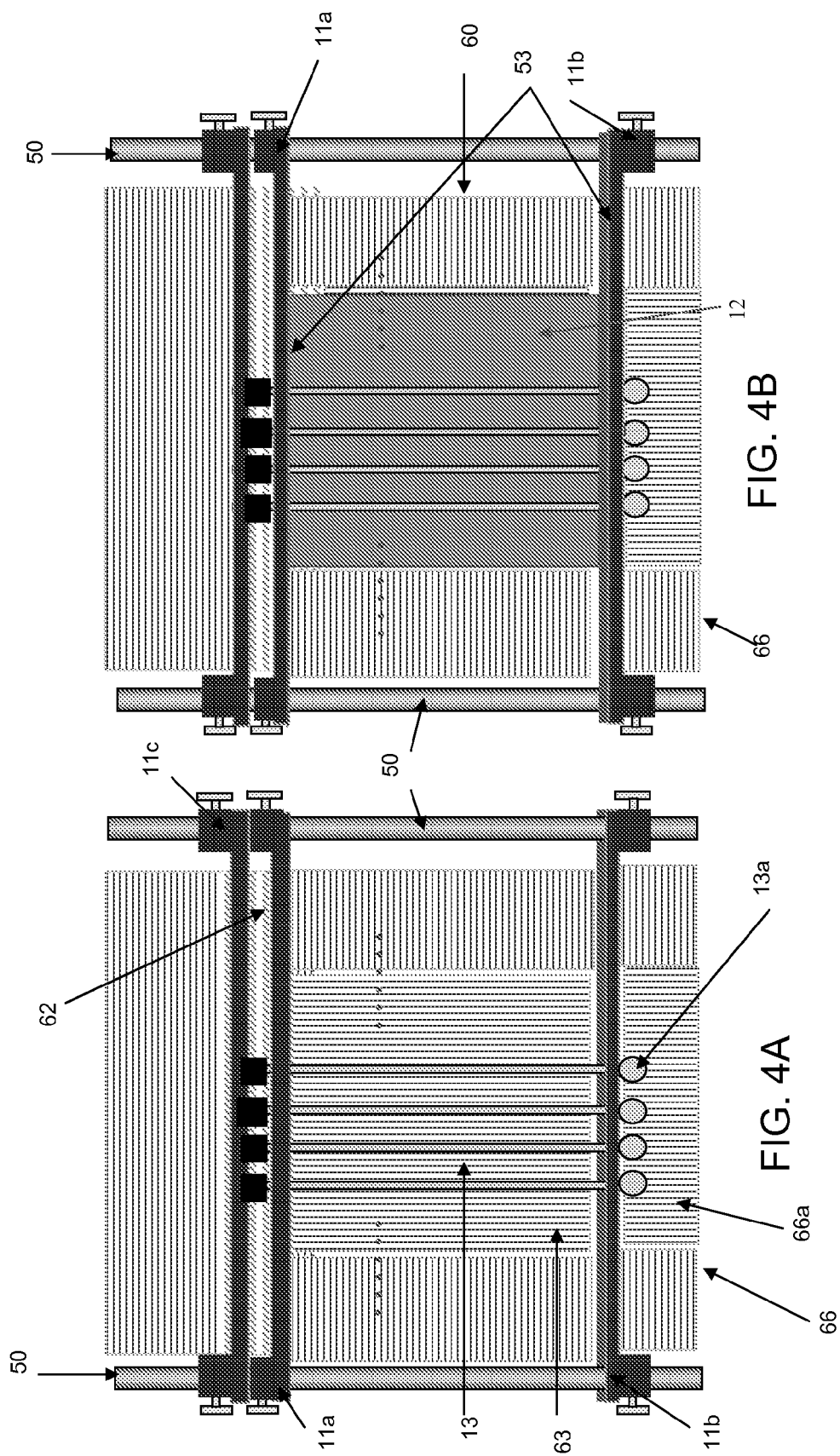

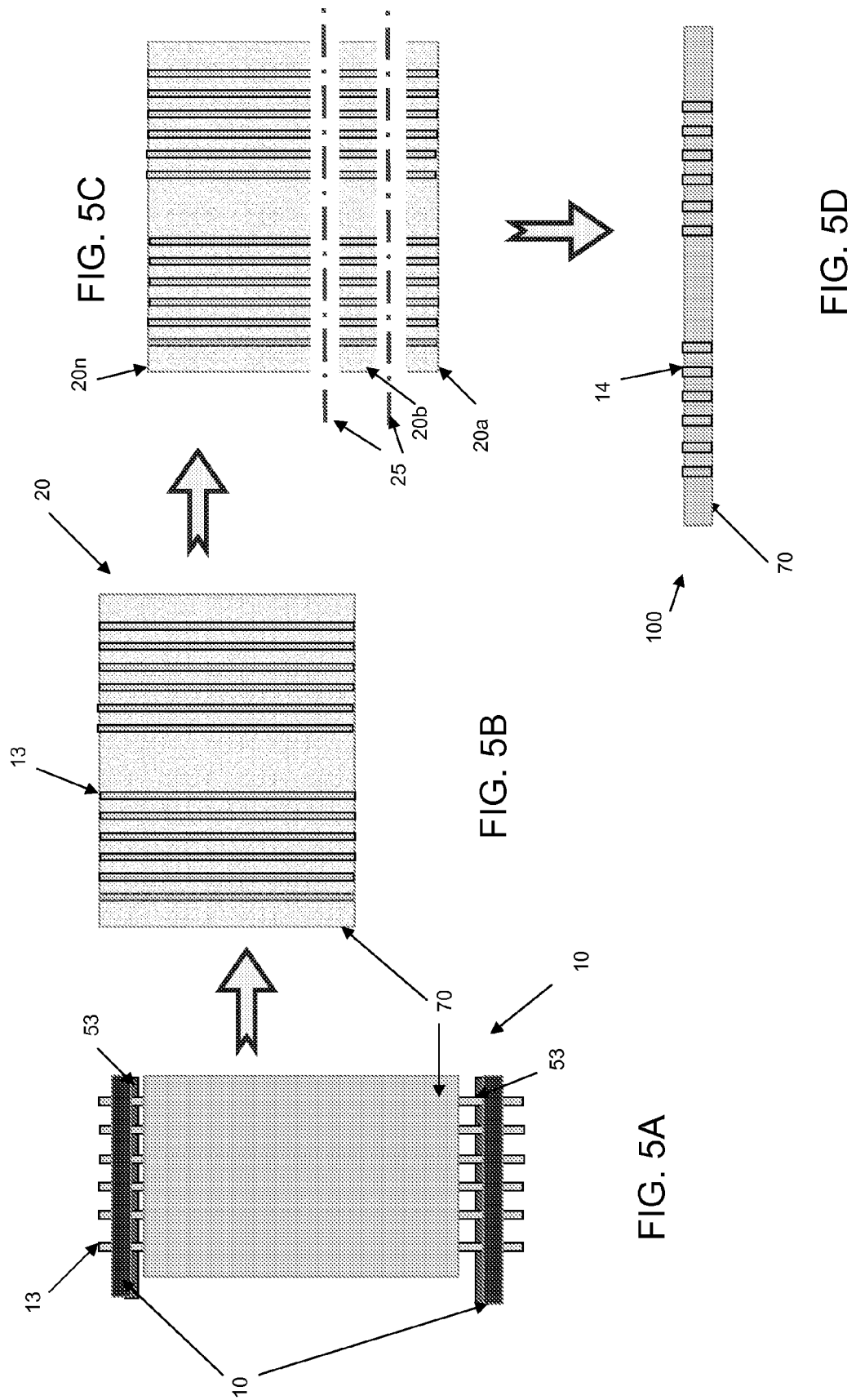

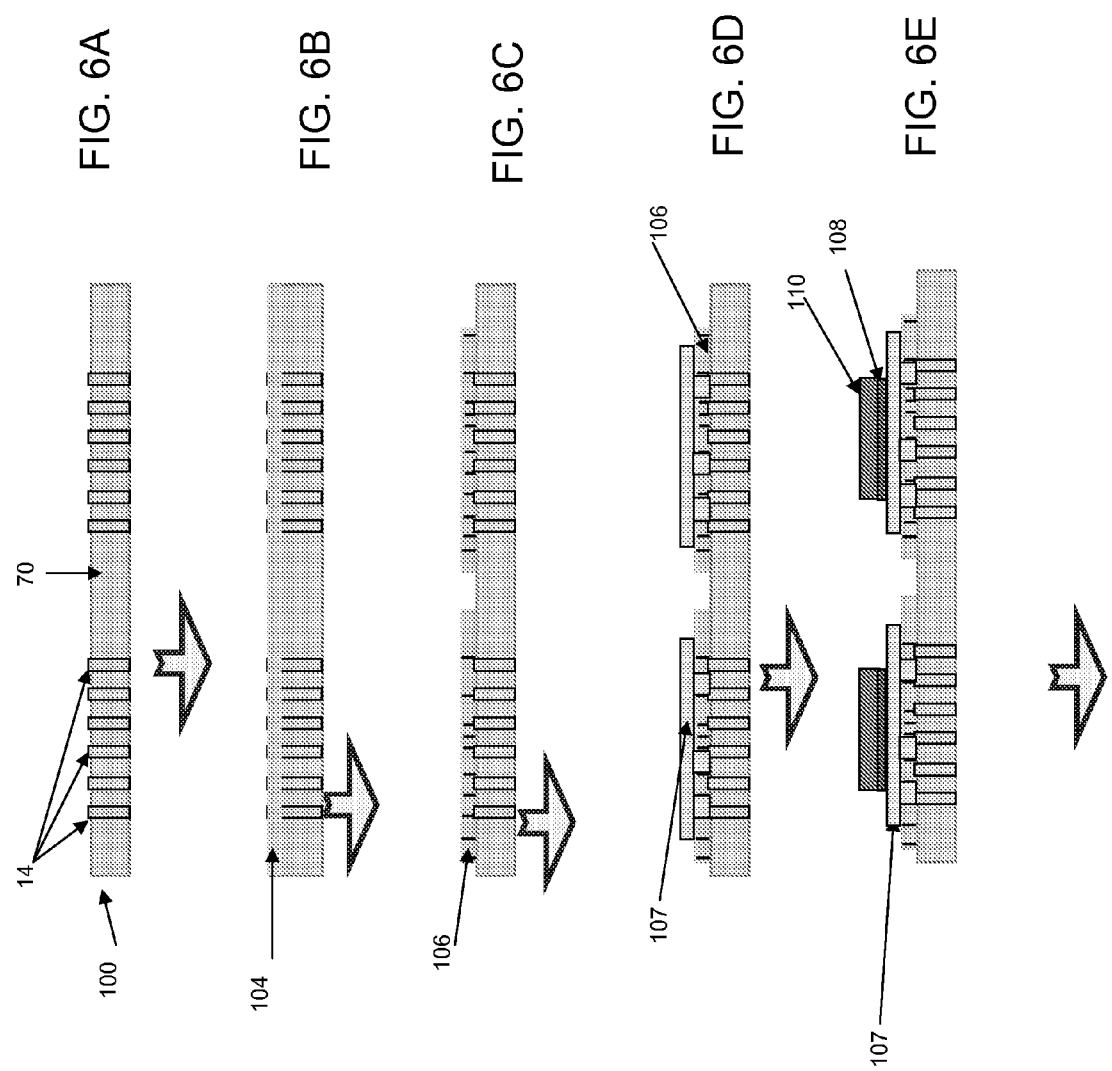

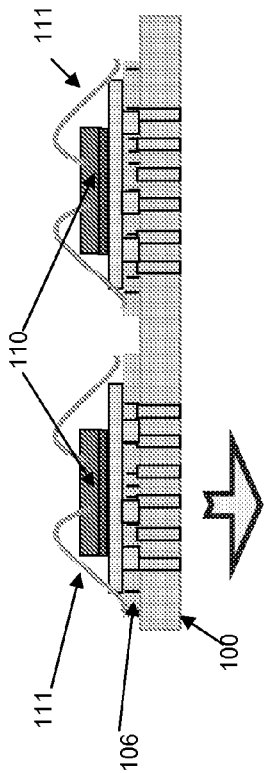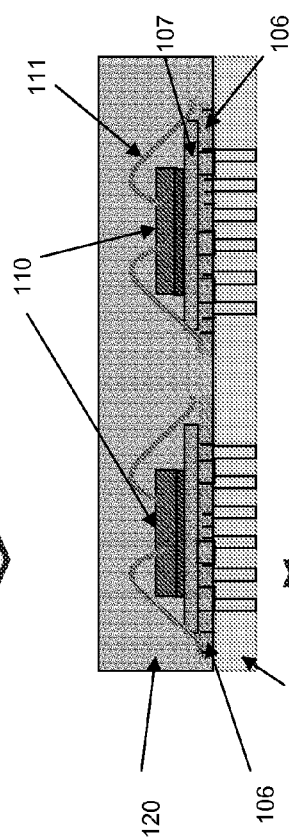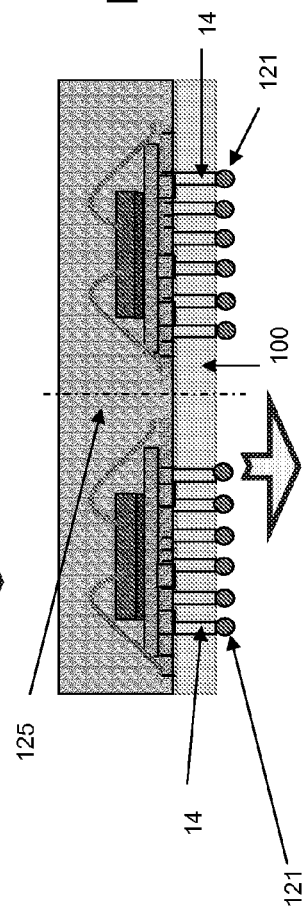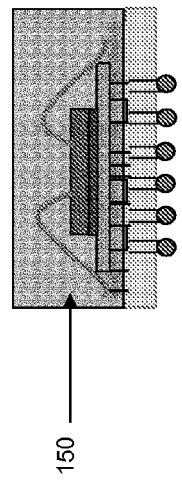

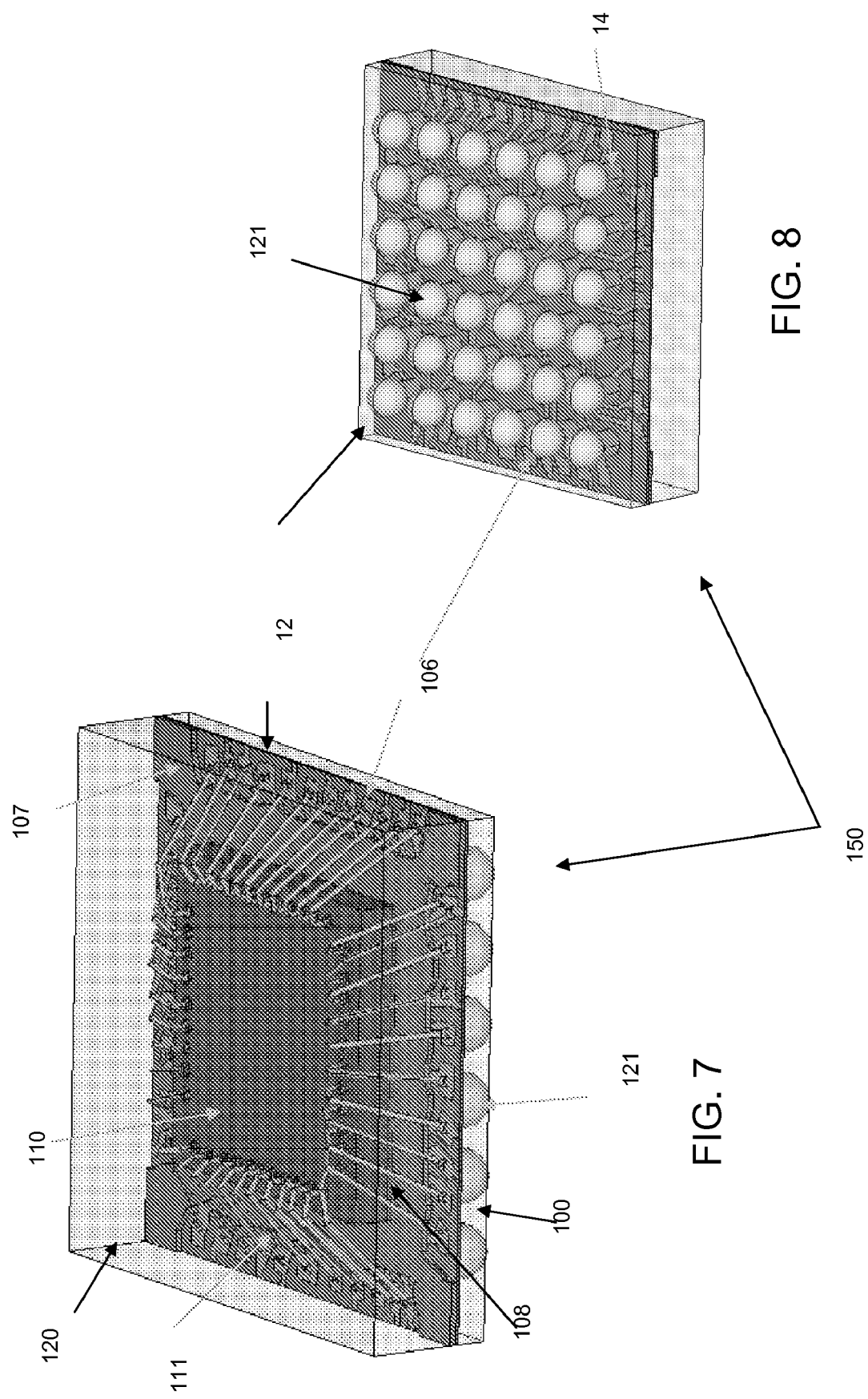

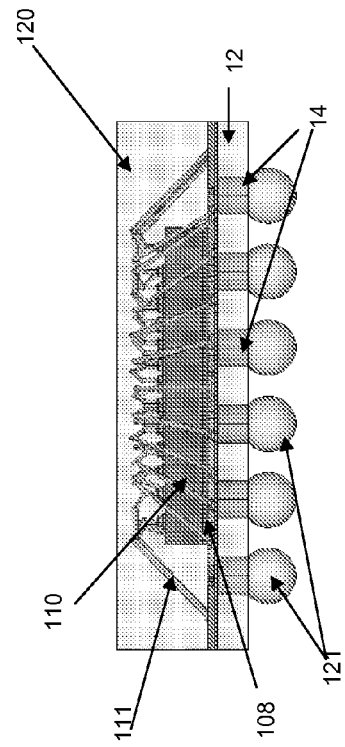
FIG. 9
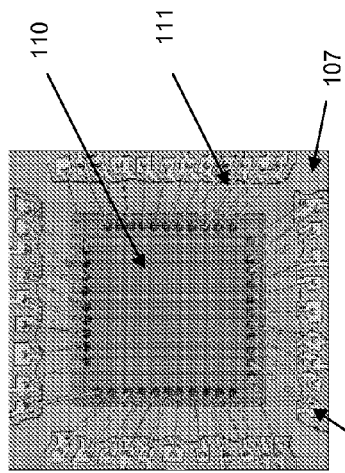
FIG. 10
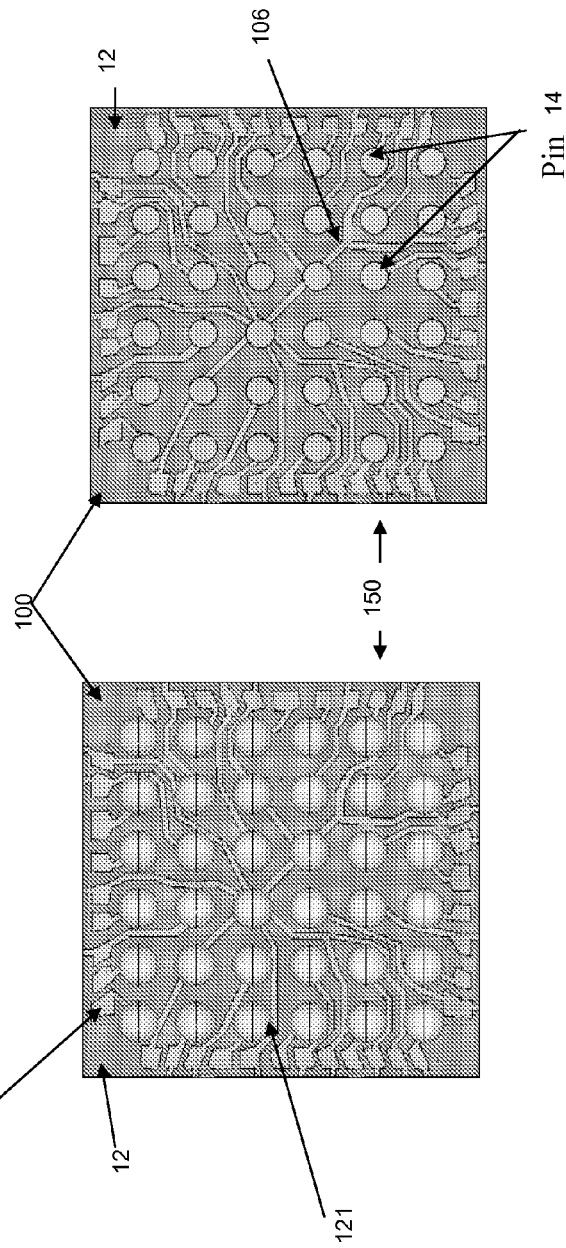
FIG. 11A
FIG. 11B

PIN SUBSTRATE AND PACKAGE

CROSS-REFERENCES TO RELATED APPLICATIONS

NOT APPLICABLE

BACKGROUND

Semiconductor dies, such as integrated circuit dies, are currently used in many varied applications, including power and control systems. Such semiconductor dies can be fragile, and can require protection from environmental conditions. Often, dies can be packaged so that they are protected. A housing or the like in the semiconductor die package can protect a semiconductor die. The semiconductor die package allows an electrical connection to made to the die and can allow for the transfer of heat from the die.

One type of semiconductor package is a ball grid array (BGA) package. Solder balls are used as electrical interconnects in BGA packages. In a BGA package, an array of solder balls is used to couple a semiconductor die to a printed circuit board (PCB). The solder balls are typically electrically connected to plated hollow vias in an intermediate substrate. The hollow vias can be plated with a conducting material. Typically, both the top and bottom surfaces of one or more insulating layers in the substrate are coated with conductive traces. The semiconductor die is on one side of the intermediate substrate while the solder balls are at the other side of the intermediate substrate. Solder balls may be in contact with those conductive traces so that the plated vias are electrically coupled to electrical terminals in the semiconductor die. At least the semiconductor die can be covered in an epoxy molding material or another protective material, leaving the solder balls exposed for electrical connection.

BGA packages are compact and can minimize stray capacitances and inductances, as they provide for a more direct connection to an underlying circuit substrate (as compared to a leaded chip package with a molded housing). However, BGA packages could be enhanced and improved to provide for a more robust design. Creating such packages, including plating hollow vias (to allow for electrical connection to the solder balls) is time consuming and expensive. Furthermore, current BGA packages may suffer from poor thermal performance and can overheat the semiconductor dies inside.

Embodiments of the invention address this problem and other problems, individually and collectively.

BRIEF SUMMARY

Embodiments of the invention are directed towards semiconductor packages and their methods of manufacture, substrates and their methods of manufacture, and systems for use in forming substrates.

One embodiment of the invention is directed to a semiconductor package comprising a substrate that comprises an insulating material and one or more pins disposed in the insulating material. The substrate has a first and a second surface, wherein the one or more pins are conductive and connect the first surface and the second surface of the substrate. A semiconductor die is attached to the first surface of the substrate.

Another embodiment of the invention is directed to a substrate for use in a ball grid array package, the substrate comprising a plurality of solid conductive pins each having a first end and a second end, and a molding material coupled to the one or more solid conductive pins, wherein the molding material leaves exposed the first end and the second end of each of the plurality of solid conductive pins.

Another embodiment of the invention is directed to a method of forming a semiconductor package, comprising obtaining a substrate comprising one or more pins, wherein the one or more pins electrically couple a first surface and a bottom surface of the substrate, and attaching a semiconductor die to the first surface of the substrate.

Another embodiment of the invention is directed to a method of forming a substrate for use in a semiconductor package, the method comprising placing a plurality of conductive pins in a mold, filling the mold with a molding compound, curing the molding compound to create a pre-substrate block, and cutting the pre-substrate block.

Another embodiment of the invention is directed to a system for forming pre-substrate blocks, the system comprising a fixture, wherein the fixture contains holes configured to guide pins, a guide slidably coupled to the fixture, and a mold coupled with the fixture, wherein the mold is configured to receive a molding compound surrounding pins held by the fixture.

These and other embodiments of the invention are described in detail in the Detailed Description with reference to the Figures. In the Figures, like numerals may reference like elements and descriptions of some elements may not be repeated. In addition, in the Figures, some elements may not be drawn to scale. Some elements may be shown as being larger or smaller than other elements for ease of illustration.

BRIEF DESCRIPTION OF THE DRAWINGS

FIGS. 1A and 1B show a side and top schematic view, respectively, of a fixture used in creating a pre-substrate block according to an embodiment of the invention.

FIGS. 2A and 2B show a side and top view, respectively, of a fixture being used to dispose an array of pins in a pre-substrate block according to an embodiment of the invention.

FIGS. 3A and 3B show side and perspective views, respectively, of a mold according to an embodiment of the invention.

FIGS. 4A and 4B show side views of a mold being used to create a pre-substrate block according to an embodiment of the invention.

FIGS. 5A-5D show steps in a process of creating a substrate according to an embodiment of the invention.

FIGS. 6A-6I show steps in a process of creating a semiconductor package according to an embodiment of the invention.

FIGS. 7-10 show top, bottom, and side views, of a semiconductor package according to an embodiment of the invention.

FIGS. 11A and 11B show bottom views of semiconductor packages according to embodiments of the invention.

DETAILED DESCRIPTION

Figure 2D:
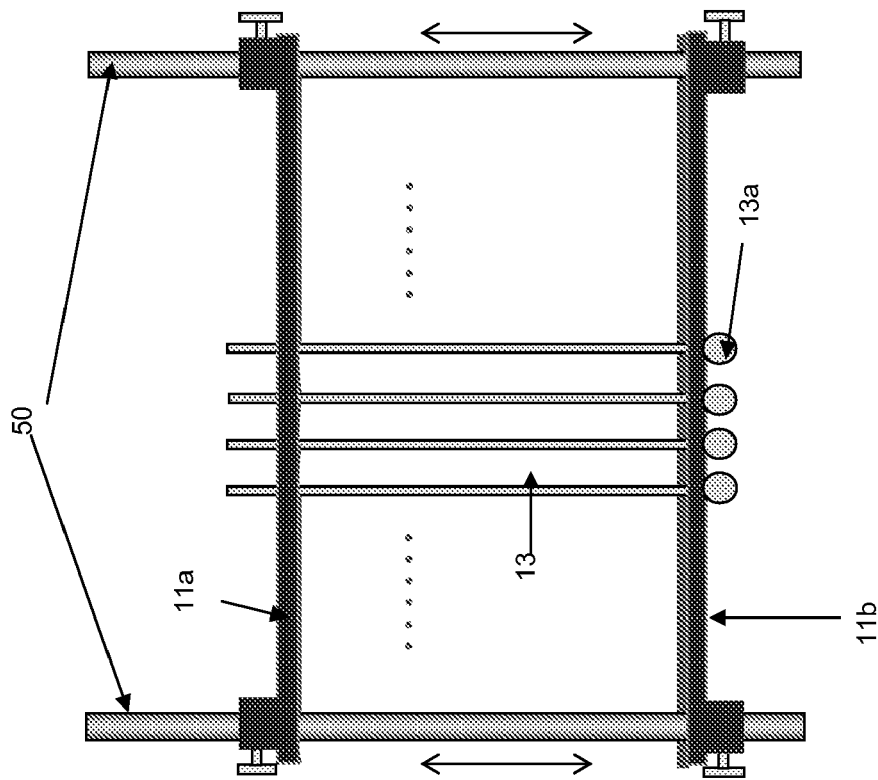
FIGS. 2C-2E show side views of a fixture being used to create a substrate according to an embodiment of the invention.

Embodiments of the invention are directed to semiconductor die packages, substrates for use in semiconductor packages, molds and methods of making the same. In an exemplary embodiment, a semiconductor die package includes a semiconductor die attached to a top surface (an example of a first surface) of a substrate. The substrate can comprise an insulating (i.e. non-conductive material), with one or more pins present within the insulating material. As used herein, a "pin" may include a pin that is solid, and is formed during the formation of the substrate. The pins can be made of solid conducting material, and can electrically couple the top surface and the bottom surface (an example of a second surface) of the substrate. Either or both of the first and second surfaces of the substrate can include both end surfaces of the pins, and an exterior surface of the non-conductive material. The exterior surface and the end surfaces may be substantially co-planar with the surface of the insulating material. The semiconductor die can be electrically coupled to the pins by a conductive trace that is patterned on the top side of the substrate. Solder balls can be attached directly to the conductive pins on the bottom side of the substrate, or may be electrically coupled to conductive traces at the bottom side of the substrate, thereby allowing the semiconductor die to be electrically coupled to a printed circuit board or the like.

FIGS. 1A and 1B show side and top views respectively of a fixture used in creating a pre-substrate block according to an embodiment of the invention. Border line 15 indicates the side of the fixture in both figures, for reference purposes. The fixture 10 can be used in conjunction with a mold (not shown), or as part of a mold (not shown), to create a pre-substrate block that has one or more pins disposed within it. In certain embodiments, the fixture 10 can include plates 11. The plates 11 can have disposed within them holes 19. Through these holes 19 can be threaded wires 13, which will be used to form pins. The wires 13 can be flexible or rigid. As shown in FIG. 1A, the wires 13 can be substantially parallel to each other when the substrates are formed.

A material such as an epoxy molding compound 12 can be filled within a mold (not shown) and cured. The cured material can then be sliced into substrates, for use in packaging. Embodiments of the devices and methods according to the invention will be described below in greater detail with references to the figures.

Methods according to embodiments of the invention can be described with reference to FIGS. 2A-5D. In these embodiments, a fixture is used to hold wires in place, and a separate mold is used to form the pre-substrate block around the wires. In other embodiments, the fixture and mold can be a single unit, or can comprise multiple units working together.

FIG. 2A shows a side view of a fixture 10, and FIG. 2B shows a top view of the fixture 10, both according to an embodiment of the invention. The fixture 10 includes a top plate 11a and a bottom plate 11b. The plates are slidably coupled to guides 50, such that they can move inward and outward along the guides (e.g., each plate can move both towards and away from the other). The plates 11a, 11b, can be coupled to the guides 50 by fasten columns 51, which can wrap around the poles that comprise guides 50. Fasten columns 51 may comprise a single unit along with their respective plates 11a, 11b, or can be separate pieces attached to their respective plates 11a, 11b. The plates 11a, 11b can be held in place along the guides 50 by use of the fastening screws 52. Tightening the fastening screws 52 can provide friction to hold plates 11a and 11b where they are located, whereas loosening fastening screws 52 can allow the plates 11a and 11b to slide inward and outward. The inner side of both plate 11a and plate 11b can be coated with a release layer 53. Release layer 53 can act to prevent an insulating material such as a molding material (such as an epoxy molding compound) from sticking to the plates 11a and 11b. Release layer 53 can comprise wax paper, a wax powder that can be sprayed onto the plates, or other suitable quick release medium.

To form a substrate according to an embodiment of the invention, wires 13 may be inserted into holes 19 in the top plate 11a and bottom plate 11b. The holes 19 may have any suitable shape and/or dimension, but are circular in this example. The wires 13 may be inserted into the holes 19 such that they fit snugly therein.

Figure 2C:
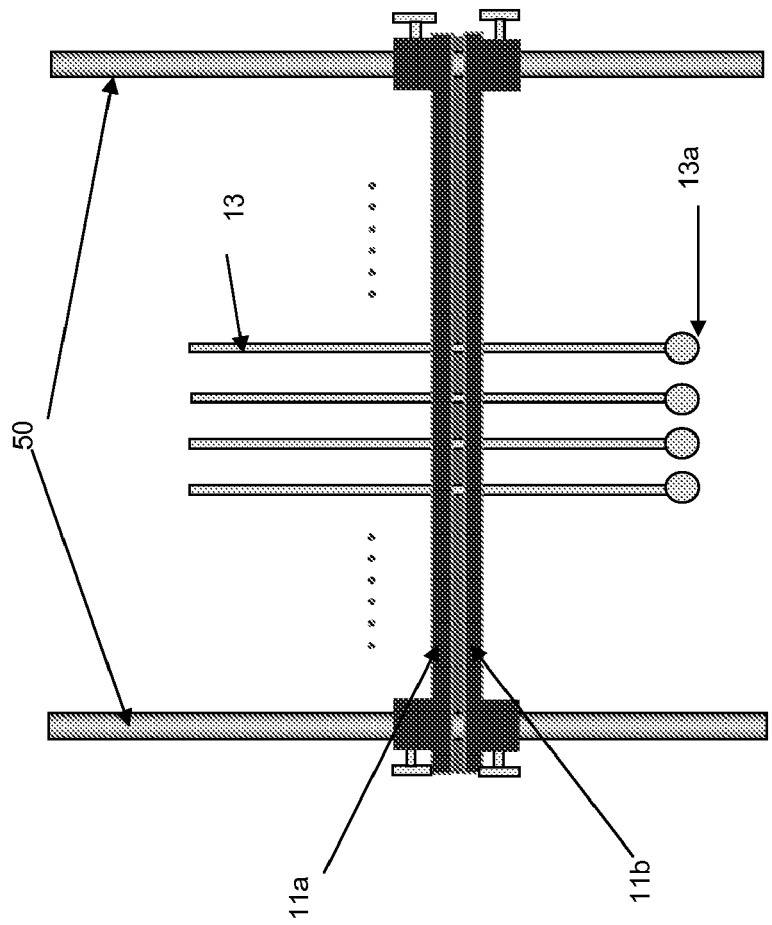

The wires 13 can come from spools, coils or other suitable configurations (not shown), and can be threaded through the holes 19 while still on the spools, or the wires 13 can be separate strands. Once the wires 13 are inserted into the fixture as shown in FIG. 2A, the bottoms of the wires 13 can be melted to form flash balls 13a (e.g., using an electrical flash process) as shown in FIG. 2C. In alternative embodiments, ball shaped material such as a metal or plastic can be attached to the bottoms of wires 13 to form balls 13a. Next, the top plate 11a and the bottom plate 11b can be moved outward while still keeping wires 13 aligned, along guides 50 as shown in FIG. 2D. The bottom plate 11b can be moved outward until it reaches the flash balls 13a, which can serve to hold the plate in place.

Figure 2E:
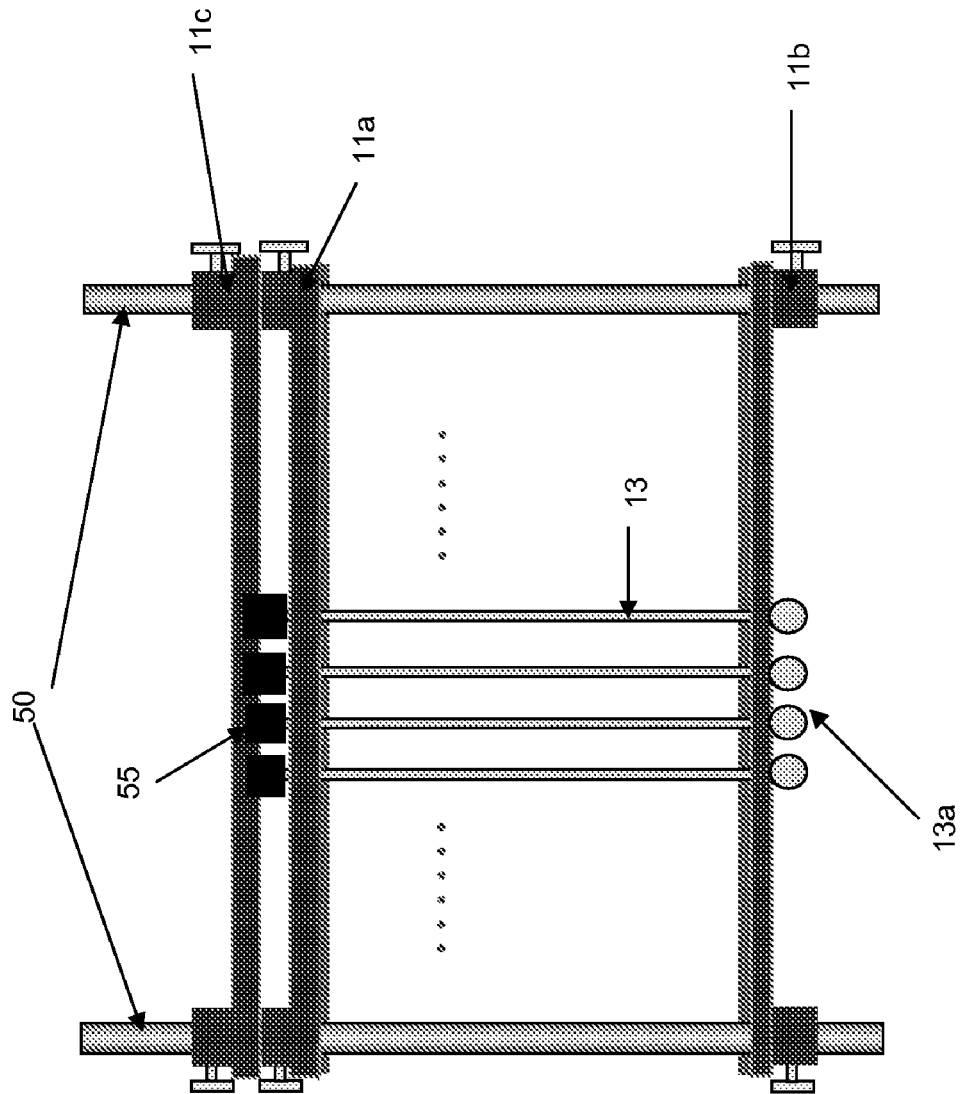

In FIG. 2E, the tops of wires 13 can be cut and bent. In certain implementations the wires 13 can be bent 90 degrees to lie flat against top plate 11a. The bent part of wires 13 can then be clamped to the top plate 11 with blocks 55. The wires 13 may be cut if they are from spools of wire, or other wire sources. Blocks 55 may be placed onto the bent wires 13 and held in place with plate 11c. In certain embodiments, blocks 55 may be part of plate 11c. In these embodiments, after wires 13 are bent, plate 11C may be attached to the guides 50 and moved inwards towards plate 11a, until the blocks 55 squeeze the bent portions of wires 13 against plate 11a.

In exemplary embodiments, the wires 13 can be stretched tight between top plate Ha and bottom plate 11b, and held in place by the balls 13a and blocks 55. This can serve to keep the wires straight so that they can be vertical pins in a substrate, as will be described below. In certain embodiments, flash balls and blocks can be interchangeable. For example, flash balls may be used to hold the wires 13 against both the top and bottom plates 11a, 11b, or blocks may be used to hold the wires 13 against both the top and bottom plates 11a, 11b. The blocks on either the top or bottom may be held in place by a corresponding plate, such as plate 11c described above. In certain examples, the wires 13 may be held against top plate 11a by means of flash balls, and may be held against bottom plate 11b by means of blocks and a corresponding plate.

FIGS. 3A-3B show a mold 60 that can be used to create a pre-substrate block according to an embodiment of the invention. FIG. 3A shows a cut away side view of the mold and FIG. 3B shows a bottom perspective view. The sides 61 and sides 64 of the mold can be used to maintain a molding compound around the wires 13 of FIG. 2E, which can reside in cavity 63. The slot 62 provides room for the top plate 11a and plate 11c.

The mold 60 is placed around the wires 13 in FIG. 4A. Plates 11a and 11c can fit within slot 62. In certain embodiments where flash balls are used with plate 11a to maintain the position of wires 13, both the flash balls (not shown) and plate 11a can fit within slot 62. Mold 60 can fit within guides 50 while surrounding wires 13 within cavity 63. A mold support 66 is placed below the mold, and can help provide support for bottom plate 11b and mold 60. When mold 60 is filled with molding material it may become heavy, and mold support 66 can prevent bottom plate 11b from sagging. Mold support 66 can have a recess or hole 66a to provide room for flash balls 13a. In FIG. 4B, mold 60 can be filled with a molding compound 12, such as an epoxy molding compound, from an opening in the mold (not shown). The molding compound 12 can surround the wires 13, and be held in place by the top plate 11a, the bottom plate 11b, and the mold 60.

Once the molding compound 12 is cured as shown in FIG. 5A, the mold and fixture 10 can be opened and the cured molding compound 70 containing the wires 13 can be removed in FIG. 5B. The removal can be aided by release layers 53, which can prevent the cured molding compound from sticking. In embodiments where the mold and fixture are combined in a single unit, the unit can be split open in order to access the cured molding compound inside. The cured molding compound 70 and internal wires 13 can form a pre-substrate block 20. The pre-substrate block 20 can then be separated into individual substrates 20a, 20b . . . 20n as shown in FIG. 5C. The number of substrates (n) that can be formed from the pre-substrate block 20 can depend on the thickness of the block 20 and the desired thicknesses of the substrates. Each substrate can then be used as a substrate 100, comprising pins 14 and cured molding compound 70 as shown in FIG. 5D.

The pre-substrate block 20 can be cut into individual substrates using any suitable process. In certain embodiments, the pre-substrate block 20 can be separated by sawing along the saw lines 25. It is noted that sawing is one cutting method that could be used in embodiments of the invention. For example, in other embodiments of the invention, a laser cutting process could be used instead of a sawing process. A sawing process, however, can result in burrs left from the sawing on the individual substrates. A pressure gas injection can be used to blow the burrs off of the individual substrates. If relatively large burrs remain, the surfaces of the individual substrates can be further cleaned with a solvent or soap, or by a plasma or ultrasonic process. The sawed surfaces of the individual substrates can then be polished, such as by a chemical mechanical polishing process as is known in the art.

FIGS. 6A to 6I show side views of a method of forming a semiconductor package using a substrate 100 according to an embodiment of the invention. In illustrated embodiments herein, the substrate 100 is coupled to one or a plurality of semiconductor dies. The substrate 100 can be made as described above, and can contain one or more (i.e., a plurality) of conductive pins 14 disposed within a block of cured molding compound 70. The pins 14 can each comprise a solid conducting material such as a transition or noble metal. Suitable materials include copper, aluminum, or gold. Copper is inexpensive and can be used in certain exemplary embodiments, while gold is highly conductive but more expensive, and is used in alternative embodiments. In FIG. 6(a), the substrate 100 comprises a molding material and pins 14 passing through the molding material 70 such that end surfaces of the pins 14 are substantially co-planar with the surfaces of the molding material and also form at least part of the opposing major surfaces of the substrate 100. In this embodiment, neither a conductive trace nor a solder mask need be present at the opposing major surfaces of the substrate 100.

Substrate 100 can be polished and plated with a conductive material 104, as shown in FIG. 6B. The conductive material 104 can be formed by any suitable process, such as an electroless plating and/or electroplating process, and can comprise a suitable conductive material such as copper, aluminum, gold, or an alloy such as nickel-copper-gold alloy. Then, in FIG. 6C, the conductive material 104 can be etched, by suitable processes known to one skilled in the art, to form a processed substrate comprising a conductive trace 106 at a top surface of the substrate 100.

If a solder mask is to be formed on the substrate, a solder mask 107 can be formed on conductive trace 106 and over the top surface of the molding material 70 as in FIG. 6D. The solder mask 107 may comprise, for example, an epoxy liquid, such as an acrylic-epoxy, that is silkscreened through the pattern on to the substrate. Other types of solder masks that can be used include liquid photo-imageable (LPI) solder masks and dry film photo-imageable (DFPI) solder masks. LPI solder masks can be silkscreened or sprayed on the substrate. DFPI solder masks can be vacuum laminated on the substrate and then exposed and developed. Other suitable solder masks may be used as is known in the art, including polymer solder masks.

One or more semiconductor dies 110 can then be attached to the substrate as in FIG. 6E. The semiconductor die 110 can be attached to the substrate using a die attach material 108 such as a conductive epoxy, solder, or other conductive bonding agent known in the art.

Semiconductor die 110 can comprise any of a variety of semiconductor dies known in the art. In exemplary embodiments, semiconductor die 110 comprises an integrated circuit such as a control circuit or other circuitry. In certain embodiments, semiconductor die can comprise a power circuit, such as a vertical power metal oxide field effect transistor (MOSFET) device. In these embodiments, it may be desirable to attach the semiconductor die to the substrate 100 as described above. However, in certain implementations where thermal performance is less of a concern, the semiconductor die 110 can be attached directly over the conductive trace 106 by means of a non-conductive die attach material (not shown). The non-conductive die attach material may comprise a silica filled epoxy or other suitable material. Using a non-conductive die attach material can allow for a package that does not require the solder mask 107, and can hence be more cost effective. In those embodiments, a die attach material is disposed between a semiconductor die and a conductive trace, without a solder mask.

Once the semiconductor die 110 has been attached to the substrate 100 as shown in FIG. 6E, it can be wire bonded to the substrate 100 as shown in FIG. 6F. Bond wires 111 may comprise a material such as gold or copper. Known wire bonding processes can be used. The bond wires 111 can electrically couple the semiconductor die 110 with the conductive pins 14 via the conductive trace 106. In other embodiments, conductive clips could be used instead of bond wires. Referring to FIG. 6G, a molding material 120 is then formed over the top surface of the substrate 100, and can cover the semiconductor die 110, the bond wires 111, the conductive trace 106, and the solder mask 107. The molding material 120 may be formed of a material such as epoxy. Known molding processes (e.g., a tape assisted molding process) may be used to mold the molding material 120.

Referring to FIG. 6H, a plurality (i.e., one or more) conductive balls 121 can be attached to a bottom surface of substrate 100. The one or more conductive balls 121 can comprise solder or other suitable material, and are electrically coupled to the one or more conductive pins 14. In exemplary embodiments, each conductive ball in the plurality of conductive balls 121 can be electrically coupled to each of the one or more conductive pins 14. The one or more conductive pins 14, in turn, can electrically couple the one or more conductive balls 121 with the semiconductor die 110, by means of the wire bonds 111 and conductive trace 107. Once the plurality of solder balls 121 have been deposited on the bottom surface of substrate 100, the substrate may optionally be singulated to form individual semiconductor packages. Singulation can be done by suitable means as is known in the art, such as by sawing along dicing line 125. This will result in one or more semiconductor packages 150, as shown in FIG. 6I.

FIGS. 7-10 show a top perspective view, a bottom perspective view, a top overhead view, and a side view respectively, of a semiconductor package 150 according to an embodiment of the invention. For clarity of illustration, the molding material 120 and molding compound 12 are shown as transparent. A substrate 100 can have a top surface, upon which a conductive trace 106 may lie. On top of the conductive trace 106 lies a solder mask 107. A semiconductor die 110 has been disposed on top of the solder mask 107, and is attached to it using a die attach material 108. Solder mask 107 can be disposed between the trace layout 106 and the semiconductor die 110. The semiconductor die 110 is electrically coupled to the conductive trace 106 by means of wire bonds 111. No conductive trace has been formed at the bottom surface of the substrate 100. A plurality of pins 14 pass through at least part of the substrate 100. The pins 14 are electrically coupled to one end to the conductive trace 106 that is disposed on the top surface of the substrate 100. The pins 14 are electrically coupled on the opposite end to the plurality of conductive balls 121. In an exemplary embodiment, each ball in the plurality of balls 121 is electrically coupled to a single, corresponding pin in the plurality of pins 14. Furthermore, each ball is located directly beneath its corresponding pin as shown in FIGS. 8 and 10, such that no conductive trace is needed on the bottom surface of the substrate.

FIGS. 11A and 11B each show a bottom view of a semiconductor package. In FIGS. 11A and 11B, the molding compound 12 is shown as transparent for purposes of illustration. Regarding FIG. 11A, a plurality of conductive balls 121 are shown attached to a bottom surface of substrate 100. A conductive trace 106 is disposed at the top surface of substrate 100, and is visible due to the transparency of the molding compound 12. Each of the conductive balls is electrically coupled to and located directly below a corresponding conductive pin 14. FIG. 11B shows the same view as FIG. 11A, only with the conductive balls not shown for illustrative purposes. As shown in FIG. 11B, each pin is electrically coupled to the conductive trace 106, which can couple with the semiconductor die 110. Attached to each conductive pin 14 can be a separate conductive ball. The plurality of conductive balls 121 are electrically coupled to a semiconductor die (not shown) in the package, and allow for the semiconductor die to engage in electrical communications with external devices such as circuit boards, etc.

Embodiments of the invention have a number of advantages. Embodiments of the invention provide for significant cost savings. Such cost savings can be attained by using a substrate comprising conductive pins as described herein. A higher number of processing steps and more materials used in a package will lead to higher manufacturing costs. Embodiments of the invention can reduce processing steps and required materials. Disposing the pins within a molding compound to form a substrate is a novel, yet simple and economical method of forming a semiconductor die package. Solid conducting pins can provide good thermal performance compared to the prior art. Placing the conductive balls directly below the conductive pins increases packaging efficiencies and reduces costs. Furthermore, embodiments of the substrate require a conductive trace on only a single surface, further reducing costs, manufacturing times, and reducing chances of manufacturing errors. In certain implementations, even a solder mask is not needed. Solid conductive pins also provide for better electrical performance than hollow vias, since the former contain more conductive material, thereby providing for a low resistance patch between a top surface of a substrate and a bottom surface of a substrate.

The pins used in embodiments of the invention are formed concurrently with the processing of the molding material, to form the substrate. Such pins can comprise a transition metal such as copper. Being formed during the formation of the substrate provides for pins that can be of a single contiguous material (or plated material). Further, such simultaneous processing allows for faster and more cost effective production of substrates, as once formed, the substrate already contains the necessary conductive pins. Also, in certain embodiments, the substrate is formed from a pre-substrate block. As such, the ends of the pins are substantially level with the first and second surfaces of the molding material. This allows for the substrate to have substantially planar first and second surfaces.

While many of the specific embodiments discussed with reference to the figures use conductive balls, it is understood that the conductive balls could be replaced by other suitable conductive structures including solder bumps or conductive columns (e.g., electroplated columns such as electroplated copper columns).

As used herein "top" and "bottom" surfaces are used in the context of relativity with respect to a circuit board upon which the semiconductor die packages according to embodiments of the invention are mounted. Such positional terms may or may not refer to absolute positions of such packages.

The semiconductor die packages described above can be used in electrical assemblies including circuit boards with the packages mounted thereon. They may also be used in systems such as phones, computers, etc.

Any recitation of "a", "an", and "the" is intended to mean one or more unless specifically indicated to the contrary.

The terms and expressions which have been employed herein are used as terms of description and not of limitation, and there is no intention in the use of such terms and expressions of excluding equivalents of the features shown and described, it being recognized that various modifications are possible within the scope of the invention claimed.

Moreover, one or more features of one or more embodiments of the invention may be combined with one or more features of other embodiments of the invention without departing from the scope of the invention.

What is claimed is:

1. A method of forming a substrate for use in a semiconductor package, the method comprising:
    inserting a plurality of conductive wires into an alignment fixture;
    placing at least a portion of the plurality of conductive wires and at least a portion of the alignment fixture in a mold, wherein the mold is separate from the alignment fixture;
    filling the mold with a molding compound;
    curing the molding compound to create a pre-substrate block; and
    cutting the pre-substrate block, wherein cutting the pre-substrate block comprises cutting the plurality of conductive wires.

2. The method of claim 1 wherein the mold is in the shape of a square cylinder.

3. The method of claim 1 wherein the mold is in the shape of a round cylinder.

4. The method of claim 1 wherein the molding compound comprises an epoxy molding compound.

5. The method of claim 1 wherein each wire in the plurality of conductive wires includes a first end surface and a second end surface, and the molding compound comprises a first and second surface after cutting the pre-substrate block, further wherein the second surface of the molding compound is substantially co-planar with the second end surface of each wire in the plurality of conductive wires, and the first surface of the molding compound is substantially co-planar with the first end surface of each wire in the plurality of conductive wires.

6. The method of claim 1 wherein each wire in the plurality of conductive wires comprises copper.

7. The method of claim 1 wherein each wire in the plurality of conductive wires comprises gold.

8. The method of claim 6, wherein each wire in the plurality of conductive wires comprises a solid conducting material.

9. The method of claim 7, wherein each wire in the plurality of conductive wires comprises a solid conducting material.

10. The method of claim 1, wherein the alignment fixture includes a top plate having holes and a bottom plate having holes.

11. A method of forming a substrate for use in a semiconductor package, the method comprising:
    placing a plurality of conductive wires in a mold, wherein the placing a plurality of conductive wires in a mold includes placing the plurality of conductive wires within an alignment fixture, wherein the alignment fixture includes a top plate having holes and a bottom plate having holes, wherein the mold includes a slot, the method further comprising putting the top plate within the slot;
    filling the mold with a molding compound;
    curing the molding compound to create a pre-substrate block; and
    cutting the pre-substrate block.

12. The method of claim 10, wherein the placing the at least a portion of the plurality of conductive wires within the alignment fixture comprises:
    inserting top portions of the plurality of conductive wires into the holes in the top plate;
    inserting bottom portions of the plurality of conductive wires into the holes in the bottom plate;
    melting the bottom portions of the plurality of conductive wires to form flash balls; and
    moving the top plate and the bottom plate outward.

13. The method of claim 10, wherein the top plate has a top plate inner side, and the bottom plate has a bottom plate inner side, further wherein both the top plate inner side and the bottom plate inner side are coated with a release layer.

14. The method of claim 12, wherein the top plate and the bottom plate are slidably coupled to one or more guides.

15. The method of claim 14, wherein the top plate is a first top plate, the method further comprising:
    bending the top portions of the plurality of conductive wires;
    attaching a second top plate to the one or more guides;
    moving the second top plate inwards to clamp the bent top portions of the plurality of conductive wires against the first top plate.

* * * * *